United States Patent
Jung et al.

(10) Patent No.: US 9,648,738 B2
(45) Date of Patent: May 9, 2017

(54) ELECTRICAL CONDUCTORS, PRODUCTION METHODS THEREOF, AND ELECTRONIC DEVICES INCLUDING THE SAME

(71) Applicant: SAMSUNG ELECTRONICS CO., LTD., Suwon-si, Gyeonggi-do (KR)

(72) Inventors: Doh Won Jung, Seoul (KR); Yoon Chul Son, Hwaseong-si (KR); Woojin Lee, Suwon-si (KR); Jongmin Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/235,363

(22) Filed: Aug. 12, 2016

(65) Prior Publication Data

US 2017/0064822 A1 Mar. 2, 2017

(30) Foreign Application Priority Data

Sep. 2, 2015 (KR) .................. 10-2015-0123981

(51) Int. Cl.
*H05K 1/00* (2006.01)
*H05K 1/02* (2006.01)
(Continued)

(52) U.S. Cl.
CPC .............. *H05K 1/09* (2013.01); *H05K 3/22* (2013.01); *H05K 1/028* (2013.01);
(Continued)

(58) Field of Classification Search
CPC ............ H05K 1/09; H05K 1/028; H05K 3/22
See application file for complete search history.

(56) References Cited

U.S. PATENT DOCUMENTS

| 6,339,528 B1 | 1/2002 | Lee et al. |
| 6,616,875 B2 | 9/2003 | Lee et al. |
| 2014/0060644 A1 | 3/2014 | Berson et al. |

FOREIGN PATENT DOCUMENTS

| FR | 2974450 A1 | 10/2012 |
| JP | 2001093512 A | 4/2001 |

(Continued)

OTHER PUBLICATIONS

Ferber et al., "Modeling of Photovoltage and Photocurrent in Dye-Sensitized Titanium Dioxide Solar Cells", J. Phys. Chem., B, 105, 2001, pp. 4895-4903.

(Continued)

*Primary Examiner* — Jeremy C Norris
(74) *Attorney, Agent, or Firm* — Cantor Colburn LLP

(57) ABSTRACT

An electrical conductor includes a first conductive layer including a plurality of metal oxide nanosheets, wherein a metal oxide nanosheet of the plurality of metal oxide nanosheets includes a proton bonded to a the surface of the metal oxide nanosheet,
wherein the metal oxide is represented by Chemical Formula 1:

$$MO_2 \quad \text{Chemical Formula 1}$$

wherein M is Re, V, Os, Ru, Ta, Ir, Nb, W, Ga, Mo, In, Cr, Rh, or Mn, wherein the plurality of metal oxide nanosheets has a content of hydrogen atoms of less than about 100 atomic percent, with respect to 100 atomic percent of metal atoms as measured by Rutherford backscattering spectrometry, and wherein the plurality of metal oxide nanosheets includes an electrical connection between contacting metal oxide nanosheets.

16 Claims, 15 Drawing Sheets

(51) Int. Cl.
*H05K 1/09* (2006.01)
*H05K 3/22* (2006.01)
(52) U.S. Cl.
CPC ........... *H05K 2201/0326* (2013.01); *H05K 2201/0338* (2013.01); *H05K 2203/1105* (2013.01)

(56) References Cited

FOREIGN PATENT DOCUMENTS

| KR | 100314236 B1 | 10/2001 |
|---|---|---|
| KR | 100830946 B1 | 5/2008 |
| KR | 1020140033353 A | 3/2014 |

OTHER PUBLICATIONS

Fukuda et al., "Swelling, inercalation, and exfoliation behavior of layered ruthenate derived from layered potassium ruthenate", Journal of Solid State Chemistry, 182, 2009, pp. 2997-3002.
Fukuda et al., "Synthesis of Nanosheet Crystallites of Ruthenate with an a-NaFeO2-Related Structure and is Electrochemical Supercapacitor Property", Inorg.Chem, 49, 2010, pp. 4391-4393.
Gee et al., "Flexible transparent electrodes made of electrochemically exfoliated graphene sheets from low-cost graphite pieces", Displays, 34, 2013, pp. 315-319.
Sasaki Takayoshi, "Exfoliation of Inorganic Ion-exchangers with a Layered Structure and Applications", Journal of Ion Exchange, 19(2), 2008, pp. 81-87.
Shi et al., "Flexible asymmetric supercapacitors based on ultrathin two-dimensional nanosheets with outstanding electrochemical performance and aesthetic property", Scientific Reports, 3, 2013, p. 1-8.
Sugimito et al., "Electrochemical Capacitor Behavior of Layered Ruthenic Acid Hydrate", Journal of the Electrochemical Society, 151(8), 2004, A1181-A1187.
Tan et al., "Rare-earth valence and doping in T-, T'-, and T*-phase $R_2CuO_4$(R=rare earths)", Physical Review B, vol. 45, No. 5, 1992, p. 45-2593-2596.
Wang et al., "Electronics and optoelectronics of two-dimensional transition metal dichalcogenides", Nature Nanotechnolgy,vol. 7, 2012, pp. 699-712.
Wassei et al., "Graphene, a promising transparent conductor", Material Today, vol. 13, No. 3, 2010, pp. 52-59.
Yao et al., "Vertical growth of Two-Dimensional $TiO_2$ Nanosheets Array Films and Enhanced Photoelectrochemical Properties Sensitized by CdS", Electrochimica Acta, 125, 2014, pp. 258-265.

Structural Data
Formula : $Na_1Ru_1O_2$
Crystal system : trigonal
Space group : R-3m (no. 166)
Unit cell dimensions
a = 3.0184 Å
b = 3.0184 Å
c = 16.4929 Å
gamma = 120.00°

FIG. 17

| Window |
|---|
| Second OCA Layer |
| Second Transparent Conductive Film |
| First OCA Layer |
| First Transparent Conductive Film |
| Display Panel |

ELECTRICAL CONDUCTORS, PRODUCTION METHODS THEREOF, AND ELECTRONIC DEVICES INCLUDING THE SAME

CROSS-REFERENCE TO RELATED APPLICATION

This application claims priority to and the benefit of Korean Patent Application No. 10-2015-0123981, filed in the Korean Intellectual Property Office on Sep. 2, 2015, the entire content of which is incorporated herein by reference.

BACKGROUND

1. Field

Electrical conductors, production methods thereof, and a device including the same are disclosed.

2. Description of the Related Art

An electronic device, such as a flat panel display such as an LCD or LED display, a touch screen panel, a solar cell, a transparent transistor, and the like may include an electrically conductive film or a transparent electrically conductive film. It is desirable for a material of an electrically conductive film to have high light transmittance (e.g., greater than or equal to about 80% in a visible light region) and low specific resistance (e.g., less than or equal to about $1 \times 10^{-4}$ $\Omega$*cm). Currently available oxide materials for electrically conductive films include indium tin oxide (ITO), tin oxide ($SnO_2$), zinc oxide (ZnO), and the like. ITO is a transparent electrode material and is a transparent semiconductor having a wide bandgap of 3.75 eV, and may be manufactured in a large area using a sputtering process. However, in terms of application to a flexible touch panel, or a UD-grade high resolution display, ITO has poor flexibility and inevitably costs more due to limited reserves of indium. Therefore, development of an alternative material is desired.

Recently, a flexible electronic device, e.g., a foldable or bendable electronic device, has been drawing attention as a next generation electronic device. Therefore, there is a need for a material having improved transparency, relatively high electrical conductivity, and suitable flexibility, as well as transparent electrode materials.

SUMMARY

An embodiment provides a flexible electrical conductor having improved conductivity and improved light transmittance.

Another embodiment provides a method of producing an electrical conductor.

Yet another embodiment provides an electronic device including the electrical conductor.

In an embodiment, an electrical conductor includes:

a first conductive layer including a plurality of metal oxide nanosheets, wherein a metal oxide nanosheet of the plurality of metal oxide nanosheets includes a proton bonded to a surface of the metal oxide nanosheet, wherein the metal oxide nanosheet is represented by Chemical Formula 1

$$MO_2 \qquad \text{Chemical Formula 1}$$

wherein M is Re, V, Os, Ru, Ta, Ir, Nb, W, Ga, Mo, In, Cr, Rh, or Mn, wherein the plurality of metal oxide nanosheets has a content of hydrogen atoms of less than about 100 atomic percent, with respect to 100 atomic percent of metal atoms (M), when measured by Rutherford backscattering spectrometry (RBS), and wherein the plurality of metal oxide nanosheets includes an electrical connection between contacting metal oxide nanosheets.

The metal oxide nanosheets can have a content of hydrogen atoms of less than about 60 atomic percent (at %), with respect to 100 at % of metal atoms (M), when measured by Rutherford backscattering spectrometry (RBS).

The electrical conductor may be a transparent conductive layer.

The metal oxide nanosheets may have an average lateral size of greater than or equal to about 0.5 micrometers ($\mu m$) and less than or equal to about 100 $\mu m$, and may have a thickness of less than or equal to about 5 nm.

The first conductive layer can be a discontinuous layer including an open space between the metal oxide nanosheets, and an area ratio of the open space with respect to the total area of the first conductive layer may be within about 50%.

The metal oxide nanosheets may have peaks of a T structure in X-ray diffraction analysis.

The first conductive layer may further include a binder.

The electrical conductor may further include an overcoating layer including a thermosetting resin, an ultraviolet (UV)-curable resin, or a combination thereof on the first conductive layer.

Another embodiment provides a method of producing an electrical conductor that includes providing a first conductive layer including a plurality of metal oxide nanosheets wherein a metal oxide nanosheet of the plurality of metal oxide nanosheets comprises a proton bonded to a surface of the metal oxide nanosheet, and wherein the metal oxide nanosheet is represented by Chemical Formula 1

$$MO_2 \qquad \text{Chemical Formula 1}$$

wherein M is Re, V, Os, Ru, Ta, Ir, Nb, W, Ga, Mo, In, Cr, Rh, or Mn, and heating the first conductive layer to produce the electrical conductor, wherein the heating is performed to provide a content of hydrogen atoms relative to 100 atomic percent of metal atoms of less than about 100 atomic percent of metal atoms, when measured by Rutherford backscattering spectrometry, and wherein the plurality of metal oxide nanosheets includes an electrical connection between contacting metal oxide nanosheets.

The providing a first conductive layer may further include carrying out intercalation with a sodium-substituted layered metal oxide by using an intercalant selected from an ammonium compound, an amine compound, and a combination thereof to provide a plurality of nanosheets.

The plurality of nanosheets including the metal oxide may have peaks of a T structure in X-ray diffraction analysis.

The heating may be performed at a temperature of greater than or equal to about 80° C.

The heating may be performed at a temperature of greater than about 100° C. and less than or equal to about 200° C.

The heating may be performed to provide a content of hydrogen atoms relative to 100 at % of metal atoms (M) of less than about 60 at % when measuring the metal oxide nanosheets by Rutherford backscattering spectrometry.

In another embodiment, an electronic device including the aforementioned electrical conductor is provided.

The electronic device may be a flat panel display, a touch screen panel, a solar cell, an e-window, an electrochromic mirror, a heat mirror, a transparent transistor, or a flexible display.

According to an embodiment, it becomes possible to provide a conductor having suitable flexibility and a relatively high conductivity together with enhanced transmittance by using conductive metal oxide nanosheets having a two dimensional T crystalline structure. In an embodiment, a treatment may enhance adhesion between the nanosheets and reduce the sheet resistance by removing residual matter from the surface of the nanosheets while maintaining the original crystalline structure thereof.

BRIEF DESCRIPTION OF THE DRAWINGS

The above and other advantages and features of this disclosure will become more apparent by describing in further detail exemplary embodiments thereof with reference to the accompanying drawings, in which:

FIG. 17 is a cross-sectional schematic view of an electronic device (e.g., a touch screen panel) according to an embodiment.

DETAILED DESCRIPTION

Figure 1:
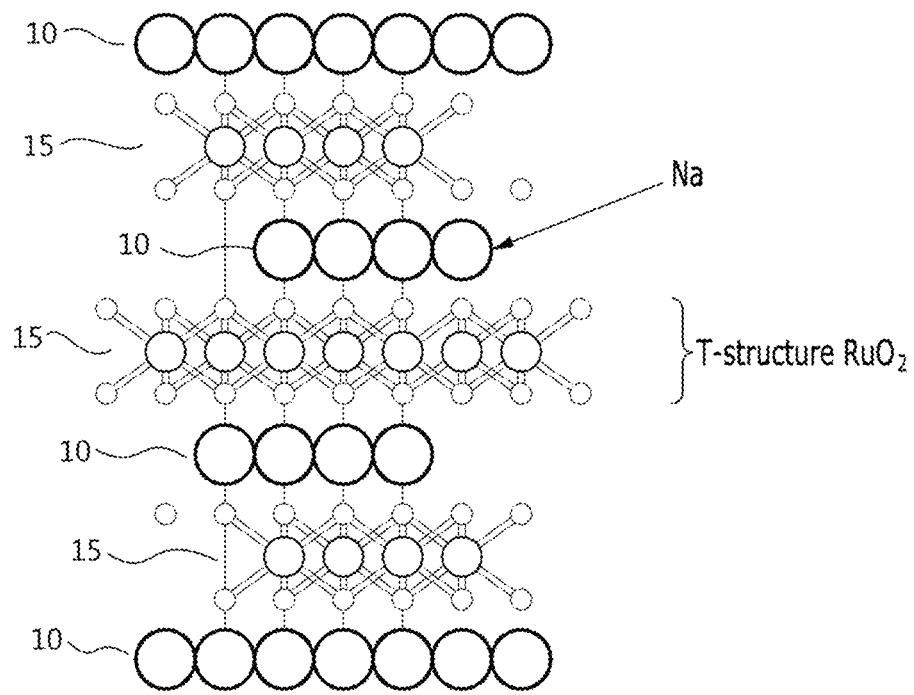
FIG. 1 is a schematic view showing a layered crystal structure of sodium substituted ruthenium oxide according to an embodiment.

Advantages and characteristics of this disclosure, and a method for achieving the same, will become evident referring to the following exemplary embodiments together with the drawings attached hereto. However, this disclosure may be embodied in many different forms and is not to be construed as limited to the embodiments set forth herein. If not defined otherwise, all terms (including technical and scientific terms) in the specification may be defined as commonly understood by one skilled in the art. The terms defined in a dictionary are not to be interpreted ideally or exaggeratedly unless clearly defined otherwise. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "and/or" includes any and all combinations of one or more of the associated listed items. "Or" means "and/or."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the "proton" refers to the particle formed when hydrogen loses an electron thereof, and includes, for example, $H^+$ and hydronium ions ($H_3O^+$), but is not limited thereto.

As used herein, the term "sheet resistance" refers to the value determined by 4-point probe method for a specimen having a predetermined size (e.g., a specimen of a width of 10 centimeters (cm) and a length of 10 cm).

In the specification, the transmittance is the value excepting the light absorption of a substrate.

The electrical conductor according to an embodiment includes a first conductive layer including a plurality of metal oxide nanosheets on the surface of which protons are attached. For example, the electrical conductor may be a transparent conductive layer. In the first conductive layer, at least a portion of the plurality of metal oxide nanosheets contact each other and provide an electrical connection.

Relating to Chemical Formula 1, conductivity, a light absorption coefficient, and sheet resistance of a $MO_2$ type of oxide may be estimated via simulation, and these materials may be applied for a transparent electrode material having high conductivity and a low absorption coefficient. For example, when the bulk material of a layered oxide is formed in nanosheets having a thin thickness (less than or equal to several tens of nanometers), it may ensure high transmittance in the visible light region.

The simulation is based on first-principles calculations. The first-principles calculations are a simulation method performed through quantum mechanics, and may calculate the optimized atomic structure and the electronic structure of a material. The electronic structure of a material may be a factor for calculating the conductivity and the light absorption coefficient of the material.

Figure 2:
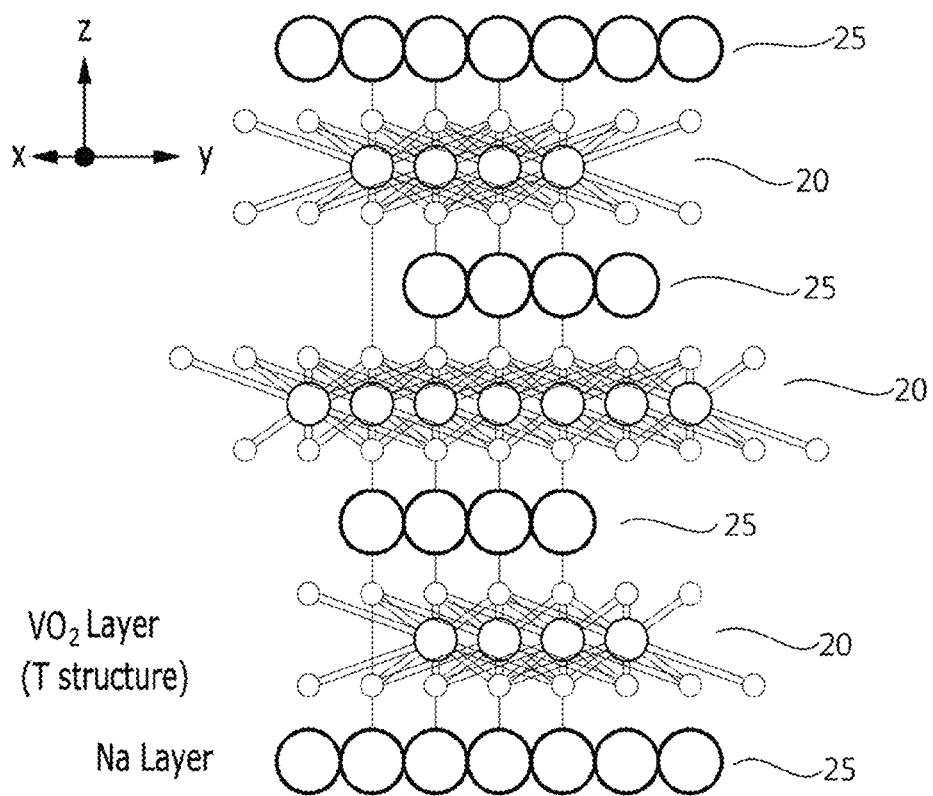
FIG. 2 is a schematic view showing a layered crystal structure of sodium-substituted vanadium oxide according to an embodiment.

First, in order to select the atomic structure of a $MO_2$-type structure including various transition metals, it may consider, for example, the structures shown in FIG. 1 and FIG. 2.

Subsequently, the conductivity and the absorption coefficient of the metal oxides represented by Chemical Formula 1 are calculated according to the following simulation process, and the transmittance and the sheet resistance with reference to 98% may be calculated based on the results.

A band structure of $ABO_3$ materials is calculated through the first-principles electronic structure calculations, the intra-band transition is calculated by the free electrons from the band structure and then conductivity and plasma frequency are calculated therefrom, from the band structure, the inter-band transition by bound electrons is calculated, a dielectric function is calculated considering the effects of bound electrons and free electrons, a square root of the dielectric function is obtained and then a refractive function of a complex number is calculated therefrom, and a refractive index of visible light and absorption of visible light are then calculated from the refractive function.

Table 1 shows simulation results of calculating conductivity and an absorption coefficient for a $MO_2$-type (M=metal) material. Considering an absorption coefficient ($\alpha$) and resistivity ($\rho$) for light having a wavelength of 550 nanometers (nm) at room temperature, $\alpha \times \rho$ is calculated, and sheet resistance (having the units ohms per square, $\Omega$/sq) for the corresponding material is calculated considering transmittance of 98%. In addition, a heat of formation (Hf) is also calculated to estimate a possibility of synthesis.

TABLE 1

|  | Hf (eV/f.u.) | σxy (S/cm) (τ = $10^{-14}$) | α_xy (1/cm) | αρ_xy ($\Omega/\square$) | Rs_xy @98% ($\Omega/\square$) |
|---|---|---|---|---|---|
| $Re_1O_2$ | −3.21 | $1.00 \times 10^5$ | $4.8 \times 10^4$ | 0.5 | 23.8 |
| $V_1O_2$ | −6.49 | $3.07 \times 10^4$ | $4.1 \times 10^4$ | 1.3 | 66.8 |
| $Os_1O_2$ | −1.62 | $6.70 \times 10^4$ | $1.1 \times 10^5$ | 1.7 | 83.2 |
| $Ru_1O_2$ | −2.19 | $3.55 \times 10^4$ | $6.0 \times 10^4$ | 1.7 | 83.7 |
| $Ta_1O_2$ | −7.01 | $4.85 \times 10^4$ | $8.6 \times 10^4$ | 1.8 | 88.2 |
| $Ir_1O_2$ | −1.71 | $3.85 \times 10^4$ | $7.8 \times 10^4$ | 2.0 | 100.2 |
| $Nb_1O_2$ | −6.89 | $3.82 \times 10^4$ | $1.0 \times 10^5$ | 2.7 | 134.6 |
| $W_1O_2$ | −4.64 | $5.32 \times 10^4$ | $1.8 \times 10^5$ | 3.4 | 169.6 |
| $Ga_1O_2$ | −3.08 | $2.11 \times 10^4$ | $9.0 \times 10^4$ | 4.3 | 210.6 |
| $Mo_1O_2$ | −4.67 | $4.42 \times 10^4$ | $1.9 \times 10^5$ | 4.3 | 215.2 |
| $In_1O_2$ | −2.42 | $2.24 \times 10^4$ | $1.0 \times 10^5$ | 4.6 | 227.7 |
| $Cr_1O_2$ | −4.74 | $1.51 \times 10^4$ | $8.1 \times 10^4$ | 5.4 | 265.6 |
| $Rh_1O_2$ | −1.89 | $3.10 \times 10^4$ | $1.7 \times 10^5$ | 5.6 | 276.1 |
| $Mn_1O_2$ | −3.93 | $1.95 \times 10^4$ | $1.2 \times 10^5$ | 6.1 | 299.8 |

Based on the results of Table 1, the metal oxide represented by Chemical Formula 1 may have relatively low sheet resistance (e.g., 300 $\Omega$/sq) even at high transmittance. Accordingly, the metal oxide included in the conductor according to one embodiment may be represented by Chemical Formula 1.

$$MO_2 \quad \text{Chemical Formula 1}$$

Herein, M is Re, V, Os, Ru, Ta, Ir, Nb, W, Ga, Mo, In, Cr, Rh, or Mn.

In an embodiment, the metal oxide may include ruthenium oxide or vanadium oxide. A plurality of metal oxide nanosheets having hydrogen ions attached, e.g., bonded, on the surface thereof may be obtained by the intercalation using an intercalant such as an alkylammonium, an alkylamine, and the like, e.g., a C1 to C16 alkylammonium, or a C1 to C16 alkylamine. These metal oxides (e.g., ruthenium oxide or vanadium oxide) may have a two-dimensional T structure as shown in FIG. 1 and FIG. 2, respectively, and may be suitable for providing for a transparent electrode material having high conductivity and a low absorption coefficient. For example, FIG. 1 is a schematic view showing a $NaRuO_2$ crystalline structure, in which the $RuO_2$ layer 15 present between the Na layers 10 has a T crystalline structure. Likewise, FIG. 2 shows a crystalline structure of a $NaVO_2$ composition, and a $VO_2$ layer 20 present between the Na layers 25 has a T-structure. The $MO_2$ bulk material includes a 2D layered structure, and may be delaminated into a single layer so as to provide nanosheets having a very thin thickness.

Figure 3:
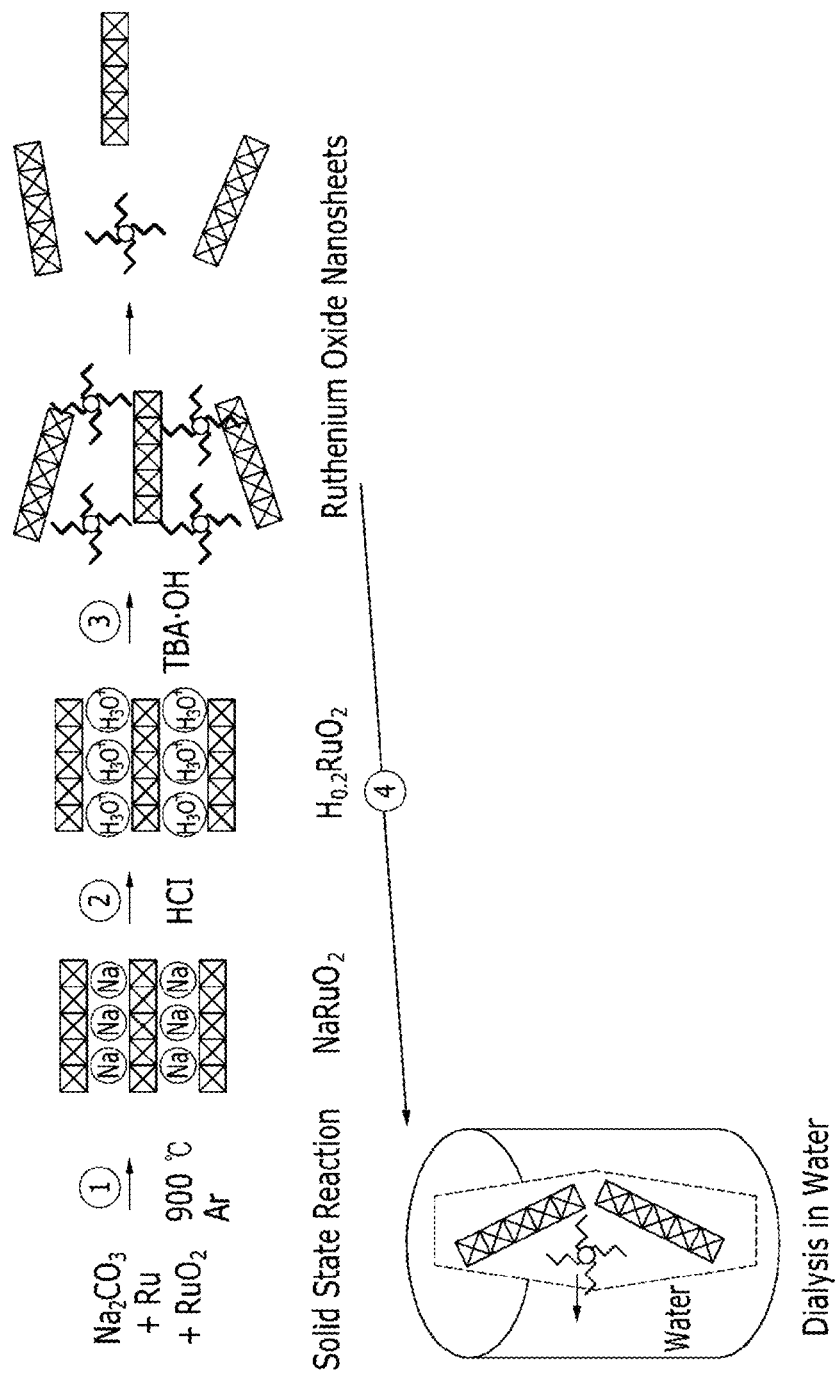
FIG. 3 is a schematic view showing a process of manufacturing ruthenium oxide nanosheets including hydrogen ions on the surface according to an embodiment.

According to an embodiment, the method of manufacturing $MO_2$-type nanosheets includes powder-synthesizing, ion-exchanging, and exfoliation processes, an embodiment of which is shown in FIG. 3. After preparation of an intermediate phase (e.g., an intermediate phase of the formula $AMO_2$, wherein A is an alkali metal such as sodium, potassium, or the like) via a solid-phase synthesis, it may be subjected to the ion exchanging and exfoliation processes, and then the alkali metal or alkaline earth metal may be removed therefrom to provide $MO_2$-nanosheets having a layered structure. For example, the ion-exchanged substituted layered metal oxide may be exfoliated by intercalation using an intercalant, wherein the intercalant can be an ammonium compound, an amine compound, or a combination thereof, such as a C1 to C16 ammonium compound, a C1 to C16 an amine compound, or a combination thereof, to provide $MO_2$ nanosheets.

The obtained nanosheets may have a sufficiently thin thickness to provide high transmittance, and may also have high conductivity as estimated by the simulation results. In addition, the electrical conductor obtained by the two-dimensional layered structure may have flexibility.

Hereinafter, the method of producing metal oxide nanosheet will be explained taking ruthenium oxide and titanium oxide as examples, but it is not limited thereto, and any suitable oxide can be used. The nanosheets of ruthenium oxide may be made from an alkali metal ruthenium oxide ($MRuO_2$) (M=Na, K, Rb, or Cs) which has a layered structure (for example $M-RuO_2-M-RuO_2-M$). The alkali metal ruthenium oxide may be obtained by mixing an alkali metal compound (e.g., an alkali metal carbonate), (optionally a metal (in the case of ruthenium oxide, ruthenium), and/or titanium oxide or ruthenium oxide and calcining or melting the obtained mixture at an appropriate temperature, for example about 500° C. to about 1000° C. When the obtained alkali metal ruthenium oxide is treated with an acid solution, at least a portion of the alkali metal is proton-exchanged to provide a proton-type alkali metal titanate hydrate or a proton-type alkali metal ruthenate hydrate. The obtained proton-type alkali metal ruthenate hydrate may react with an alkylammonium or alkylamine to provide an alkylammonium- or alkylamine-substituted compound, which is then mixed with a solvent to be exfoliated into nanosheets, thereby producing ruthenium oxide nanosheets. The solvent may be a high dielectric solvent. The solvent may be at least one selected from water, alcohol, acetonitrile, dimethyl sulfoxide, dimethyl formamide, and propylene carbonate.

For example, during the exfoliation of $NaRuO_2$, $NaRuO_2$ and an acid compound (e.g., HCl) are reacted, and thereby $Na^+$ is substituted with $H^+$ so that protonized layered ruthenium oxide ($H_xRuO_2$) may be obtained. Subsequently, the obtained $H_xRuO_2$ is reacted with an alkyl ammonium salt intercalant (e.g., tetraalkyl ammonium hydroxide and the like), so that $H^+$ is substituted with an alkyl ammonium salt (e.g., tetrabutylammonium salt, $TBA^+$). The alkyl ammonium salt may be a C1 to C16 alkyl ammonium salt compound. The intercalant molecule (e.g. $TBA^+$) having a large size is interposed between the $RuO_2$ layers to widen the gap between $RuO_2$ layers, causing the interlayer separation. Thus, when it is added into a solvent and agitated, the layers are exfoliated to provide $RuO_2$ nanosheets.

In the metal oxide nanosheets according to an embodiment, a content of hydrogen atoms, relative to 100 atomic percent (at %) of metal atoms (M) may be less than about 100 at %, for example less than or equal to about 98 at %, less than or equal to about 90 at %, less than or equal to about 85 at %, or less than or equal to about 60 at %, or about 20 at % to about 99 at %, or about 25 at % to 90 at %, or about 40 at % to 85 at % as measured by Rutherford backscattering spectrometry (RBS).

The metal oxide nanosheets obtained by the intercalation include an acid and/or an organic material used in the manufacturing process on the surface, and the material is used for forming an electrical conductor (e.g., preventing agglomeration of nanosheets or the like). However, in the view of being used as the electrical conductor, the material may increase the contact resistance between nanosheets and may negatively influence the contact between them. After manufacturing an electrical conductor, the removal of these materials present on the surface of the nanosheet may help the performance improvement of the electrical conductor, but a process for such a removal may cause some side effects (e.g., deformation or separation of the nanosheets).

As is further explained below, in the electrical conductor according to an embodiment, as measured by Rutherford backscattering spectrometry (RBS) after the preparation of the first conductive layer and the subsequent heat treatment thereto at a predetermined temperature for a predetermined time, the content of the hydrogen atoms in the metal oxide nanosheets may be less than about 100 at % with respect to 100 at % of metal atoms (M), e.g., about 20 at % to about 99 at %, or about 30 at % to 80 at %. In this case, the obtained electrical conductor may have significantly decreased resistivity. Without being bound by any particular theory, such results imply that as an organic material (particularly, a hydrogen ion component) present on the surface of nanosheets is removed by the heat treatment, the adherence between nanosheets (or adherence between the substrate and nanosheets) may be improved while the nanosheets may maintain their original crystalline structure even after the heat treatment.

The metal oxide nanosheets may have an average lateral size of greater than or equal to about 0.5 um, for example greater than or equal to about 1 um, greater than or equal to about 2 um, greater than or equal to about 3 um, greater than or equal to about 4 um, greater than or equal to about 5 um, greater than or equal to about 6 um, greater than or equal to about 9 um, or even greater than or equal to about 10 um. The metal oxide nanosheets may have an average lateral size of less than or equal to about 100 um, for example less than or equal to about 30 um, less than or equal to about 20 um, less than or equal to about 10 um, less than or equal to about 9 um, less than or equal to about 8 um, or less than or equal to about 7 um. The metal oxide nanosheets may have an average thickness of less than or equal to about 5 nm, for example less than or equal to about 4 nm, less than or equal to about 3 nm, less than or equal to about 2.5 nm, or less than or equal to about 2 nm. The metal oxide nanosheets may have an average thickness of greater than or equal to about 1 nm, for example greater than about 1 nm. When the nanosheets has a size of 0.5 μm to 100 μm, the contact resistance between nanosheets may be minimized to decrease the sheet resistance of the transparent electrode. When the average thickness is less than or equal to about 3 nm, the transmittance may be increased, and the transmittance of the transparent electrode may be improved.

The metal oxide nanosheets delaminated by the intercalation may have improved conductivity and improved light transmittance, and may also contribute the flexibility of the obtained electrical conductor, so that it may be applied for a flexible electrical conductor, for example a flexible transparent conductive layer or the like.

The first conductive layer including the metal oxide nanosheets may include a discontinuous layer including open space between the metal oxide nanosheets, and the area ratio of the open space to the total area of the first conductive layer may be less than or equal to about 50%, for example less than or equal to about 40%, less than or equal to about 30%, less than or equal to about 20%, or less than or equal to about 10%, or about 1% to about 50%, or about 2% to about 40%.

The electrical conductor having the structure may have significantly improved conductivity at the high light transmittance. The electrical conductor may have transmittance of greater than or equal to about 85%, for example greater than or equal to about 88%, greater than or equal to about 89%, greater than or equal to about 90%, or even greater than or equal to about 95%, for light having a wavelength of 550 nm at a thickness of less than or equal to about 100 nm, and in this case, the sheet resistance thereof may be significantly decreased.

The forming a first conductive layer on a substrate may be performed by a layer forming method and is not particularly limited, the details of which can be determined by one of skill in the art without undue experimentation.

The substrate may be a transparent substrate. A material of the substrate is not particularly limited, and it may be a glass substrate, a semiconductor substrate like Si, a polymer substrate, or a combination thereof, or may be a substrate laminated with an insulation layer and/or a conductive layer. For non-limiting examples, the substrate may include an inorganic material such as an oxide glass, or a glass, a polyester such as polyethylene terephthalate, polybutylene terephthalate, or polyethylene naphthalate, polycarbonate, an acryl-based resin, a cellulose or a derivative thereof, a polymer such as a polyimide, or organic/inorganic hybrid material, or a combination thereof. The thickness of the substrate is also not particularly limited, but may be appropriately selected according to the kind of final product. For example, the substrate may have a thickness of greater than or equal to about 0.5 um, for example greater than or equal to about 1 um, or greater than or equal to about 10 um, but is not limited thereto. The thickness of the substrate may be less than or equal to about 1 mm, for example less than or equal to about 500 um, or less than or equal to about 200 um, but is not limited thereto. An additional layer (e.g., an undercoat) may be provided between the substrate and the conductive layer, if needed (e.g., for controlling a refractive index).

The first conductive layer may be formed by applying an appropriate coating composition (including nanosheets) on a substrate or a second conductive layer and removing the solvent. The coating composition may further include an appropriate solvent (e.g., water, an organic solvent miscible with water or immiscible with water, or the like), a binder, and a dispersing agent (e.g., hydroxypropyl methylcellulose (HPMC) or a C2 to C20 organic acid).

For example, the composition including metal oxide nanosheets may include the following components.

TABLE 2

| | Material | Amount |
|---|---|---|
| Conductive material | RuO$_2$ aqueous solution (concentration: 0.001-10.0 g/L) | 30-70% |
| Solvent | Water | 10-50% |
| | Isopropanol | 1-20% |
| Dispersing agent | Hydroxypropyl methylcellulose aqueous solution (0.05-5 wt %) | 5-30% |

A first conductive layer is prepared by coating the composition on a substrate and selectively drying and/or heat-treating the same. The coating of the composition may be performed by various methods, for example bar coating, blade coating, slot die coating, spray coating, spin coating, gravure coating, inkjet printing, or a combination thereof. The nanosheets may contact each other for providing an electrical connection. When the prepared nanosheets are physically connected to provide as thin a layer as possible, it may provide further improved transmittance.

The first conductive layer may include an organic binder for binding the nanosheets. The binder may play a role of appropriately adjusting viscosity of the composition for a conductive layer or enhancing adherence of nanosheets on the substrate. Non-limiting examples of the binder may be methyl cellulose, ethyl cellulose, hydroxypropyl methyl cellulose (HPMC), hydroxypropyl cellulose (HPC), xanthan gum, polyvinyl alcohol (PVA), polyvinylpyrrolidone (PVP), carboxylmethyl cellulose, hydroxyethyl cellulose, or a combination thereof. An amount of binder may be appropriately selected, and is not particularly limited. In non-limiting examples, an amount of the binder may be about 1 to about 100 parts by weight based on 100 parts by weight of the nano-size electrical conductors.

The electrical conductor may further include an overcoating layer (OCL) including a thermosetting resin, an ultraviolet (UV)-curable resin, or a combination thereof, on the first conductive layer. Specific known examples of the thermosetting resin and the ultraviolet (UV)-curable resin for the OCL may be used. A method of forming an OCL from the materials on the first conductive layer is also known and is not particularly limited. In one embodiment, the thermosetting resin and ultraviolet (UV) curable resin for the OCL may include a perfluoropolymer having a (meth) acrylate group, urethane (meth)acrylate, epoxy(meth)acrylate, a poly(meth)acrylate having a (meth)acrylate group, or a combination thereof. The overcoating layer may further include an inorganic oxide particulate (e.g., silica particulate).

According to another embodiment, a method of manufacturing the electrical conductor includes providing a first conductive layer including a plurality of nanosheets including a metal oxide having hydrogen ions attached on the surface and represented by the following Chemical Formula 1:

$$MO_2 \qquad \text{Chemical Formula 1}$$

wherein M is Re, V, Os, Ru, Ta, Ir, Nb, W, Ga, Mo, In, Cr, Rh, or Mn, and heating the first conductive layer to provide a content of hydrogen atoms, relative to 100 at % of metal atoms (M), of less than about 100 at %, when the metal oxide nanosheets are analyzed by Rutherford backscattering spectrometry. According to an embodiment, the heating is to provide a content of hydrogen atoms, relative to 100 at % of metal atoms (M), of less than about 60 at %, when the metal oxide nanosheets are analyzed by Rutherford backscattering spectrometry.

The manufacturing the metal oxide nanosheets can be the same as above.

The heating the first conductive layer may be performed at a temperature of greater than or equal to about 80° C. The metal oxide nanosheets obtained by the intercalation may not be delaminated, and in this case, it may be present in a bundle including two to five layers. These metal oxide nanosheets may include the remaining components (e.g., protons) on the surface or between layers, and the H atom fraction is remarkably decreased by the heat treatment, while the oxygen fraction may be increased. In addition, the adherence between nanosheets may be improved, and the conductivity may also be improved.

For example, the first conductive layer may be heated at greater than or equal to about 90° C., greater than or equal to about 100° C., greater than or equal to about 120° C., greater than or equal to about 130° C., or greater than or equal to about 140° C. The heating the first conductive layer may be performed at a temperature of less than or equal to the temperature causing substantially no damage to the substrate. For example, the first conductive layer may be heated at a temperature of less than or equal to about 200°

C. According to one embodiment, the first conductive layer may be heated at a temperature of about 150° C. to about 200° C. Within the temperature range, the conductivity of the first conductive layer may be significantly improved without changing the structure of the metal oxide nanosheets.

The duration of heating for the first conductive layer is not particularly limited, and may be appropriately selected according to the conditions such as a heating temperature, a kind of substrate, and the like. For example, the first conductive layer may be heated for greater than or equal to about 10 minutes (min), for example greater than or equal to 30 min, greater than or equal to about 40 min, or 1 hour (h) or longer, but is not limited thereto. The first conductive layer may be heated for less than or equal to about 12 h, for example less than or equal to about 11 h, less than or equal to about 10 h, less than or equal to about 9 h, or less than or equal to about 8 h, but is not limited thereto.

In another embodiment, an electronic device includes the electrical conductor.

The electronic device may be a flat panel display, a touch screen panel, a solar cell, an e-window, an electrochromic mirror, a heat mirror, a transparent transistor, or a flexible display.

In an exemplary embodiment, the electronic device may be a touch screen panel (TSP). The detailed structure of the touch screen panel is well known. The schematic structure of the touch screen panel is shown in FIG. 17. Referring to FIG. 17, the touch screen panel may include a first transparent conductive film, a first transparent adhesive film (e.g., an optically clear adhesive (OCA)) film, a second transparent conductive film, a second transparent adhesive film, and a window for a display device, on a panel for a display device (e.g., an LCD panel). The first transparent conductive layer and/or the second transparent conductive layer may be the electrical conductor.

In addition, an example of applying the conductor to a touch screen panel (e.g., a transparent electrode of TSP) is illustrated, but the conductor may be used as an electrode for other electronic devices including a transparent electrode without a particular limit. For example, the conductor may be applied as a pixel electrode and/or a common electrode for a liquid crystal display (LCD), an anode and/or a cathode for an organic light emitting diode device, or a display electrode for a plasma display device.

Hereinafter, the embodiments are illustrated in more detail with reference to examples. These examples, however, are not in any sense to be interpreted as limiting the scope of this disclosure.

EXAMPLES

Example 1

Synthesis of Ruthenium Oxide Nanosheet

FIG. 3 schematically shows a method of manufacturing ruthenium oxide nanosheets.

$Na_2CO_3$, Ru, and $RuO_2$ are mixed at a mole ratio of 2:1:3, and the mixture is pelletized. 4 grams (g) of the obtained pellet is introduced into an alumina crucial and heated in a tube furnace at 900° C. for 12 hours (h) under an inert atmosphere (e.g., under an argon or nitrogen atmosphere), and it is subsequently heated again at the same temperature for 6 d. Subsequently, the furnace is cooled to room temperature, and the treated pellet is taken out therefrom and ground to provide a fine powder.

Figure 4:
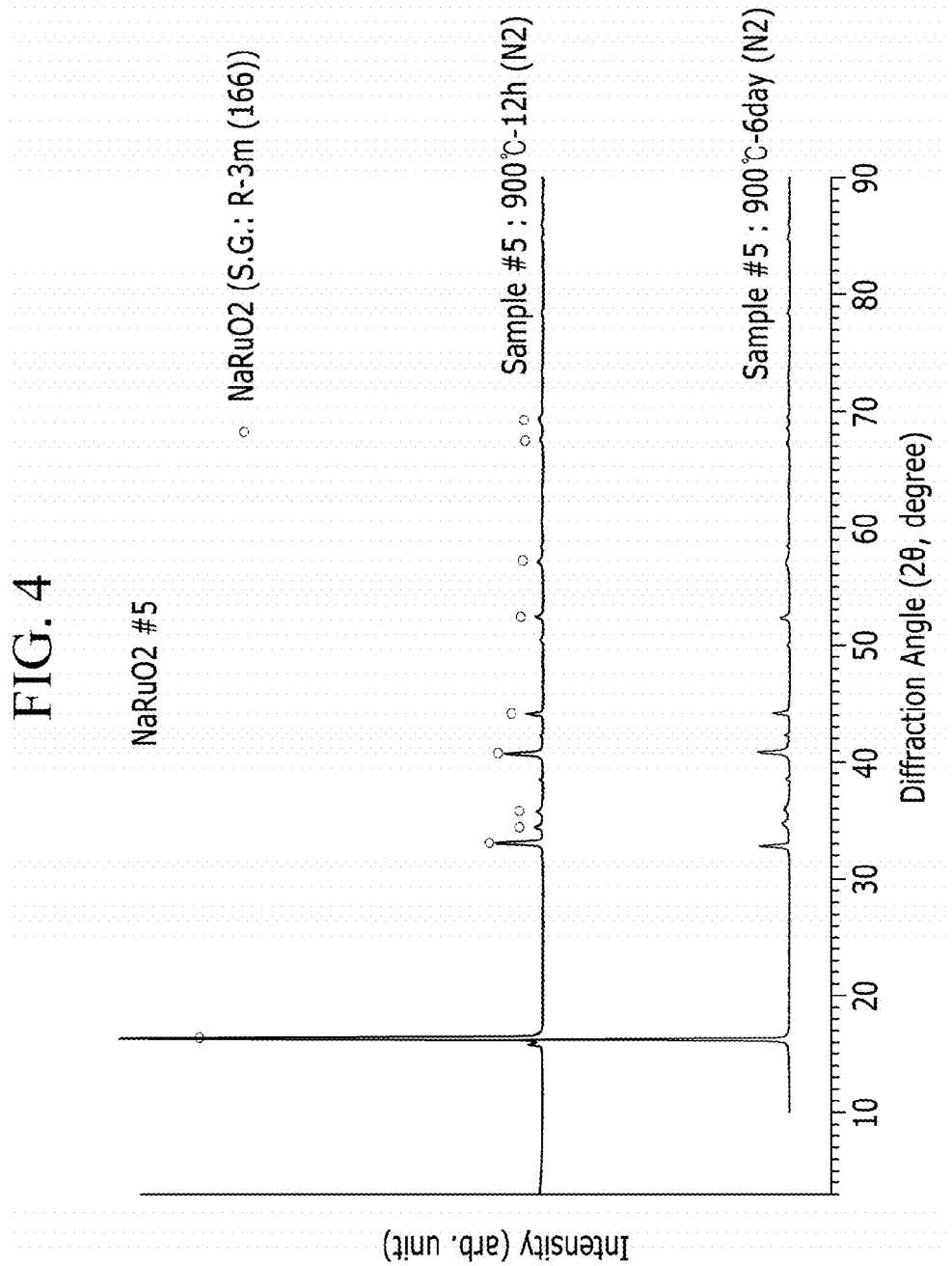
FIG. 4 is a graph of diffraction angle (2θ, degrees) versus intensity (arbitrary units) which shows an X-ray diffraction spectrum of sodium-substituted ruthenium oxide obtained from Example 1.
Figure 5:
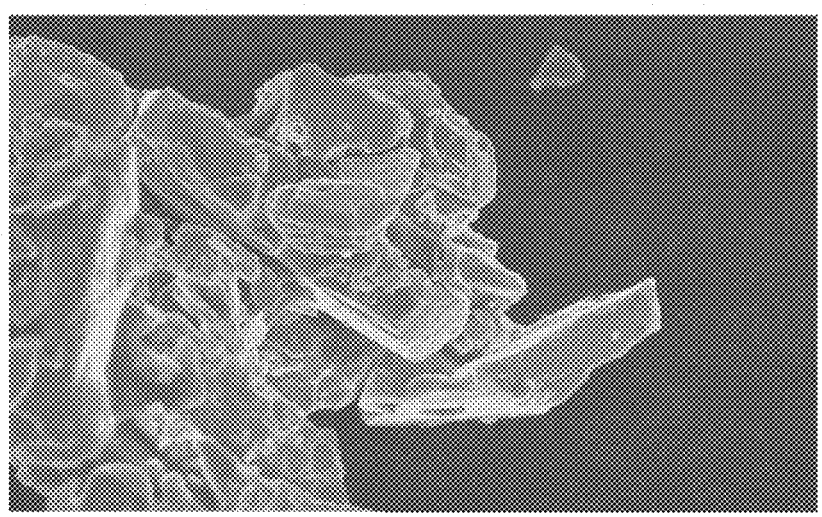
FIG. 5 shows a scanning electron microscope image of sodium-substituted ruthenium oxide obtained from Example 1.

An X-ray diffraction spectrum of the obtained $NaRuO_2$ is shown in FIG. 4. FIG. 5 shows a scanning electron microscope image of $NaRuO_2$ treated for 6 d. The results of FIG. 4 and FIG. 5 confirm that $NaRuO_2$ has a layered structure from.

The obtained powder is introduced into a 1 M HCl solution and agitated for 3 d and then filtered to provide only a powder. The obtained powder has a composition of $H_{0.2}RuO_2$.

1 g of the obtained $H_{0.2}RuO_2$ powder is introduced into 250 mL of an aqueous solution of tetrabutylammonium hydroxide (TBAOH) and agitated for greater than or equal to 10 d. In the aqueous solution, TBAOH has a concentration of $TBA+/H+=5$. After completing all processes, the final solution is centrifuged under the conditions of 2000 rpm and 30 min to obtain delaminated $RuO_2$ nanosheets.

The obtained nanosheets are subjected to X-ray diffraction analysis, atomic microscopic analysis, and transmission electron microscope analysis. The results thereof are shown in FIG. 6, FIGS. 7A and 7B, and FIG. 8, respectively.

Figure 6:
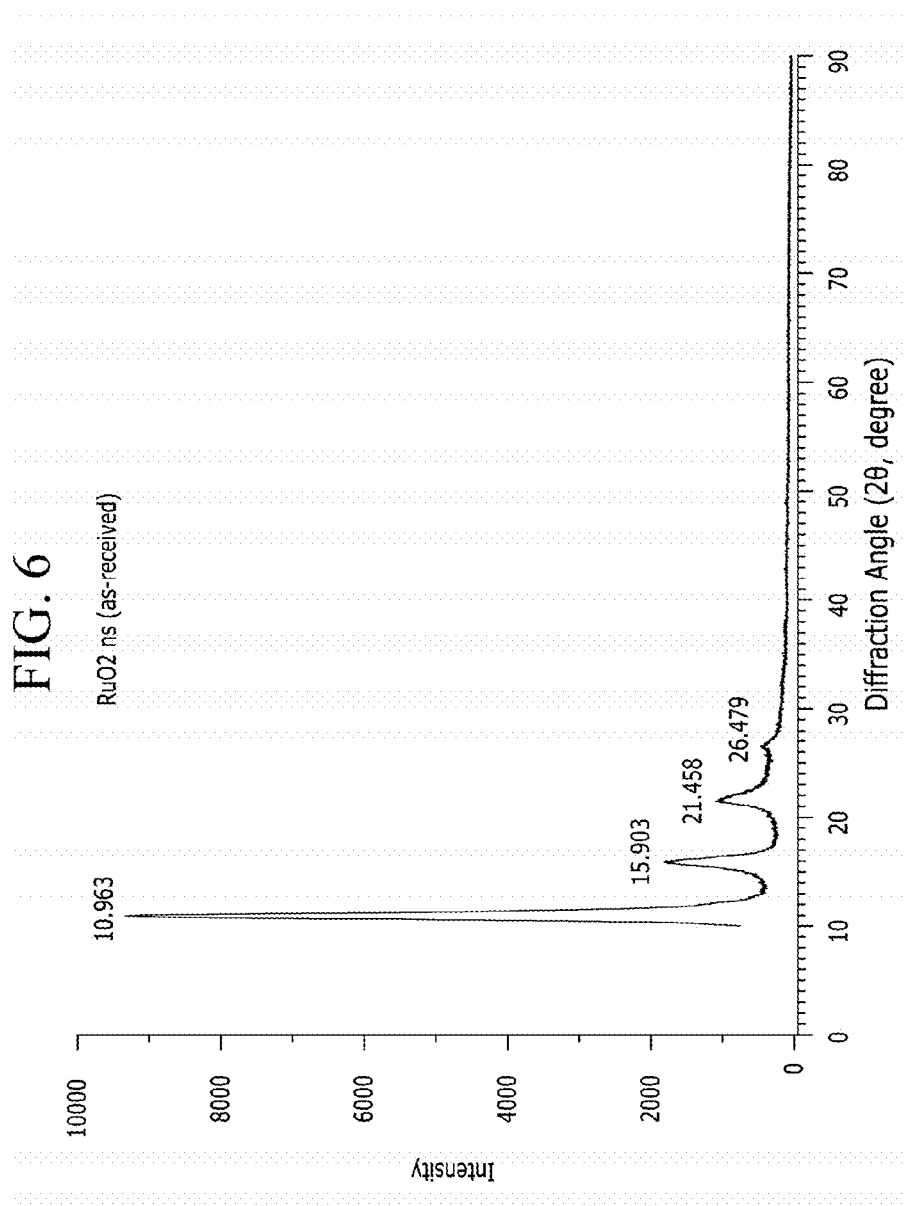
FIG. 6 is a graph of diffraction angle (2θ, degrees) versus intensity (arbitrary units) which shows an X-ray diffraction spectrum of ruthenium oxide nanosheets obtained from Example 1.
Figure 7B:
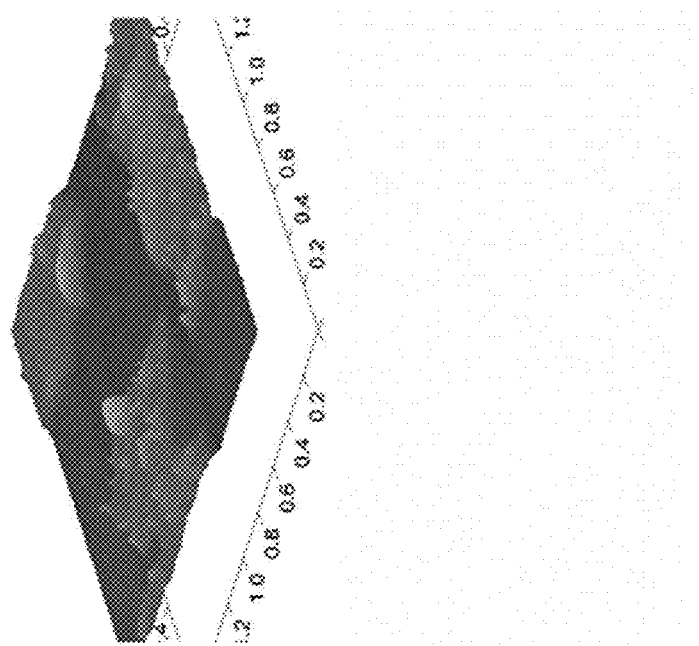
FIGS. 7A and 7B are an atomic microscope images of ruthenium oxide nanosheets obtained from Example 1.
Figure 7A:
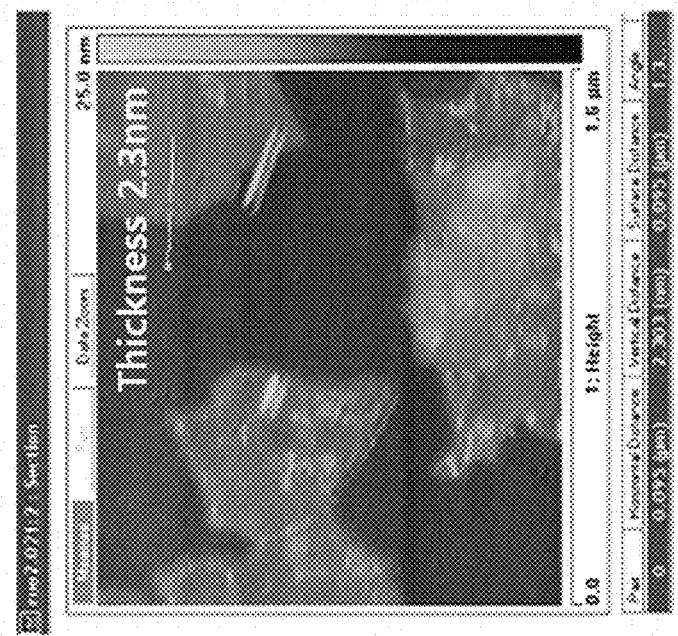
Figure 8:
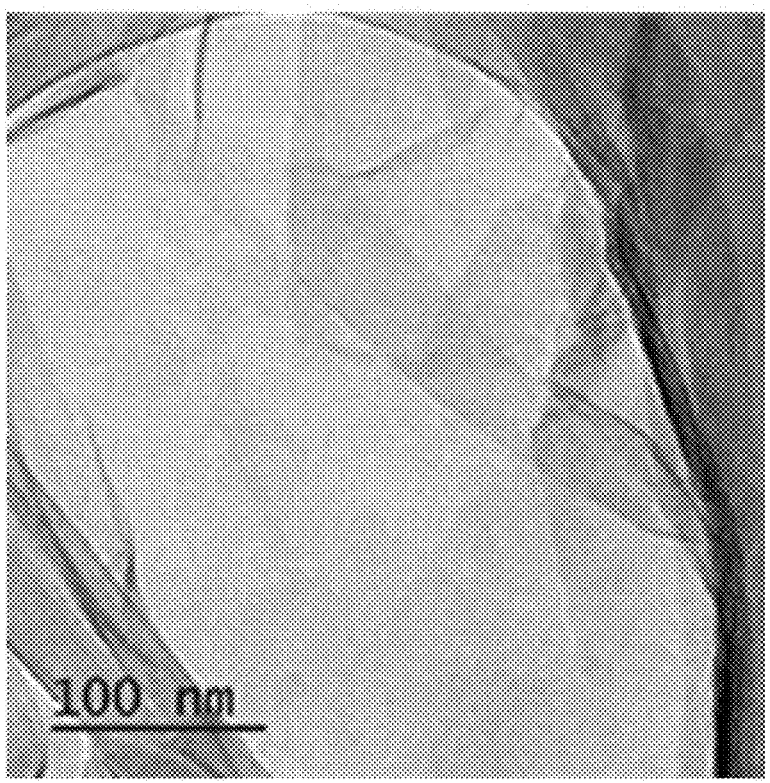
FIG. 8 is a scanning electron microscope image of ruthenium oxide nanosheets obtained from Example 1.
Figure 9:
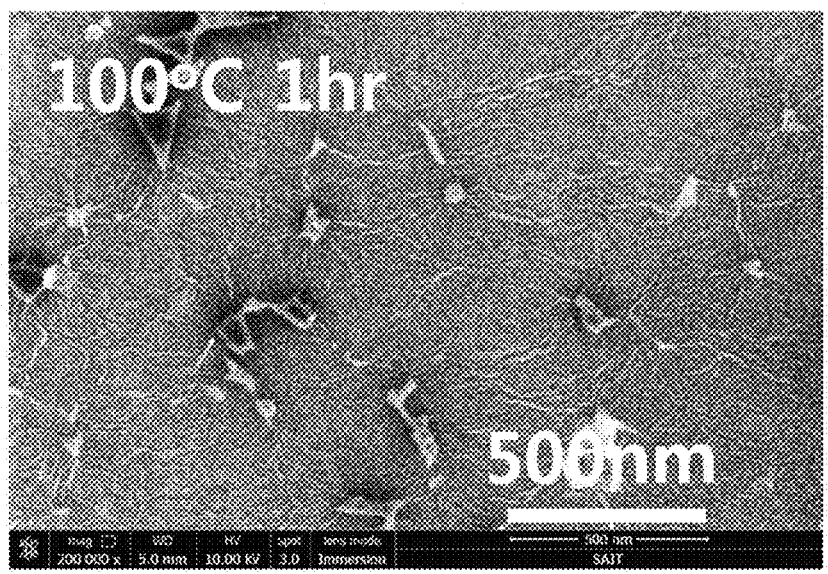
FIG. 9 is a scanning electron microscope image of a first conductive layer obtained from Example 2.

According to FIG. 6, it is confirmed that the distance between layers in the nanosheet is 0.8064 nm. From FIGS. 7A and 7B, it is confirmed that the nanosheets have a thickness of about 2 to 3 nm, and the sheet size is about 1 um. FIG. 8 shows that the obtained nanosheets have a 2D layered structure.

Reference Example 1

Synthesis of Alkaline Metal Vanadium Oxide $Na_2CO_3$ and $V_2O_3$ are mixed at 1:1 (mole ratio), and the mixture is shaped to a pellet. 4 g of the obtained pellet is introduced into a platinum crucial and heated in a tube furnace at 800° C. for 12 h under the hydrogen/nitrogen (1:9) atmosphere. Subsequently, the furnace is cooled to room temperature, and the treated pellet is taken out therefrom and ground to provide fine powder.

Figure 14:
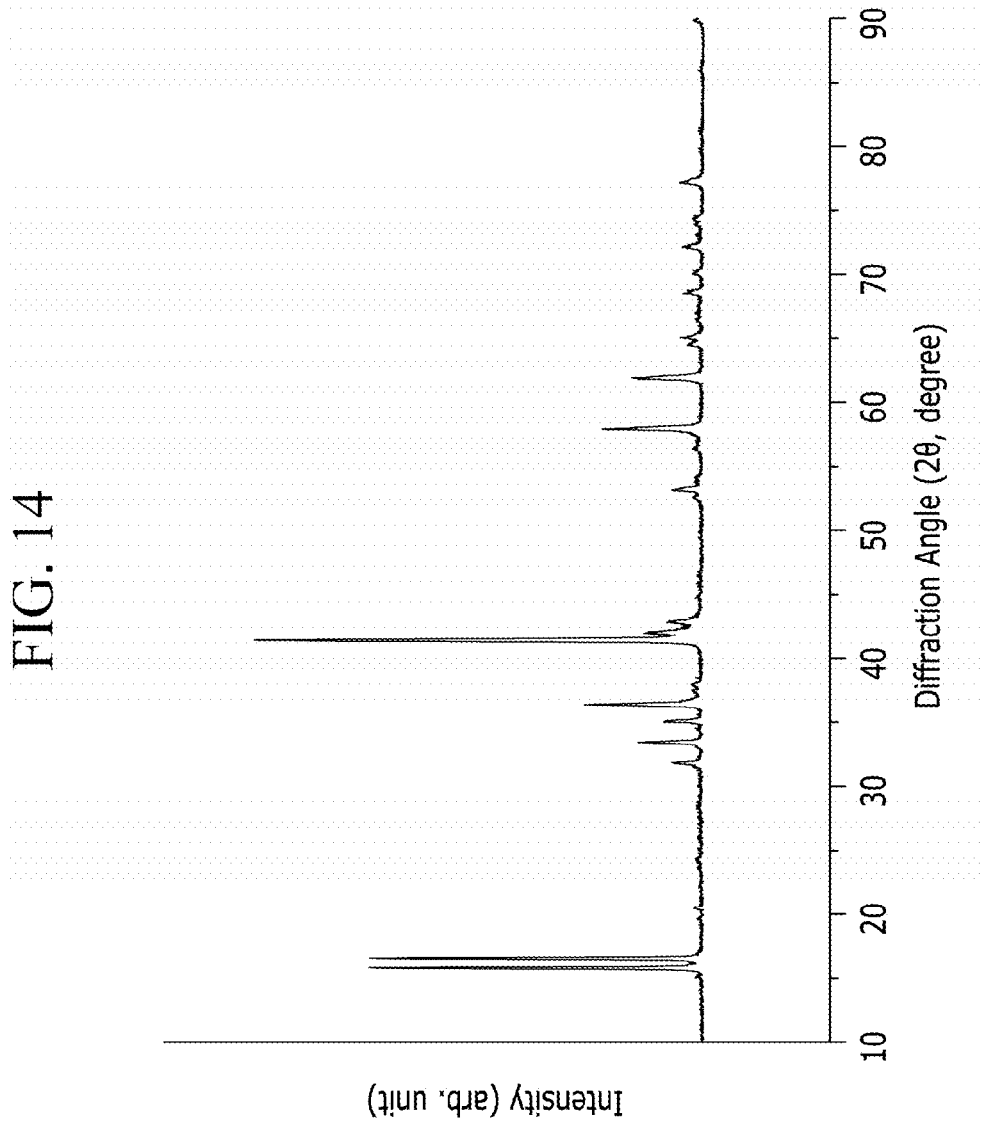
FIG. 14 is a graph of diffraction angle (2θ, degrees) versus intensity (arbitrary units) which shows X-ray diffraction analysis results of sodium-substituted vanadium oxide obtained from Reference Example 1.

An X-ray diffraction spectrum of the obtained $NaVO_2$ is shown in FIG. 14. From FIG. 14, it is confirmed that $NaVO_2$ has a layered structure.

Nanosheets may be obtained by performing the similar method to Example 1 with the obtained fine powder.

Example 2

Manufacturing Electrical Conductor Including Ruthenium Oxide Nanosheets

[1] A coating liquid including $RuO_2$ nanosheets obtained from Example 1 and having the following composition is prepared.

Aqueous dispersion liquid of the obtained $RuO_2$ nanosheets: 3 g
HPMC aqueous solution (0.3%): 0.5 g
Isopropanol: 3 g
Water: 1 g The obtained $RuO_2$ nanosheet coating liquid is bar-coated on a polycarbonate substrate and dried at 85° C. under an air atmosphere. The processes are repeated 2-6 times to provide a first conductive layer. It is confirmed that the first conductive layer obtained by the bar coating has a thickness of ~3 nm.

[2] The polycarbonate including the first conductive layer is heated at a temperature of 100° C. under an air atmosphere for one hour to provide an electrical conductor. The obtained second conductive layer is measured for sheet resistance by 4 point probe measurement (specimen size: width of 10 cm×length of 10 cm, measurement equipment manufactured by Mitsubishi Chemical Analytech, model name: MCP-T610).

Transmittance is measured by using a haze meter (specimen size: width of 10 cm×length of 10 cm, measurement equipment manufactured by Nippon Denshoku, model name: NDH-7000SP) considering only the material absorption except the light absorption of the substrate. The results are shown in the above Table 2.

Example 3

Manufacturing Electrical Conductor Including Ruthenium Oxide Nanosheets

Figure 10:
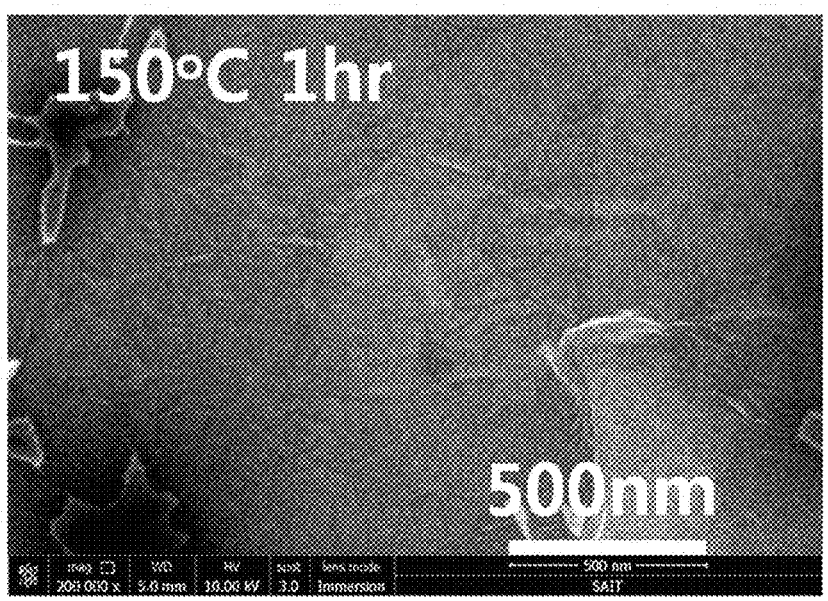
FIG. 10 is a scanning electron microscope image of a first conductive layer obtained from Example 3.

An electrical conductor is manufactured in accordance with the same procedure as in Example 2, except that the heat treatment is performed at a temperature of 150° C. A scanning electron microscope image of the obtained electrical conductor is shown in FIG. 10. The electrical conductor obtained by the same procedure as in Example 2 is measured for sheet resistance and transmittance, and the results are shown in Table 2.

Example 4

Manufacturing Electrical Conductor Including Ruthenium Oxide Nanosheets

Figure 11:
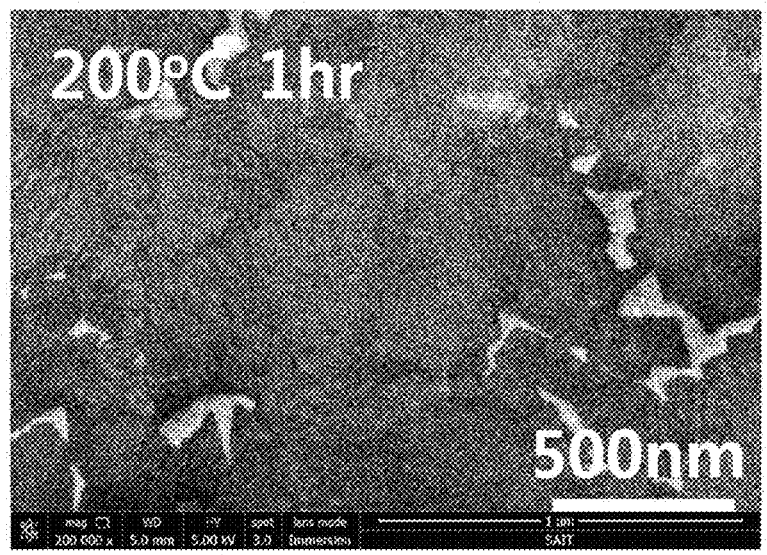
FIG. 11 is a scanning electron microscope image of a first conductive layer obtained from Example 4.

An electrical conductor is manufactured in accordance with the same procedure as in Example 3, except that the heat treatment is performed at a temperature of 200° C. A scanning electron microscope photograph of the obtained electrical conductor is shown in FIG. 11. The electrical conductor obtained by the same procedure as in Example 2 is measured for sheet resistance and transmittance, and the results are shown in Table 2.

Comparative Example 1

Figure 12:
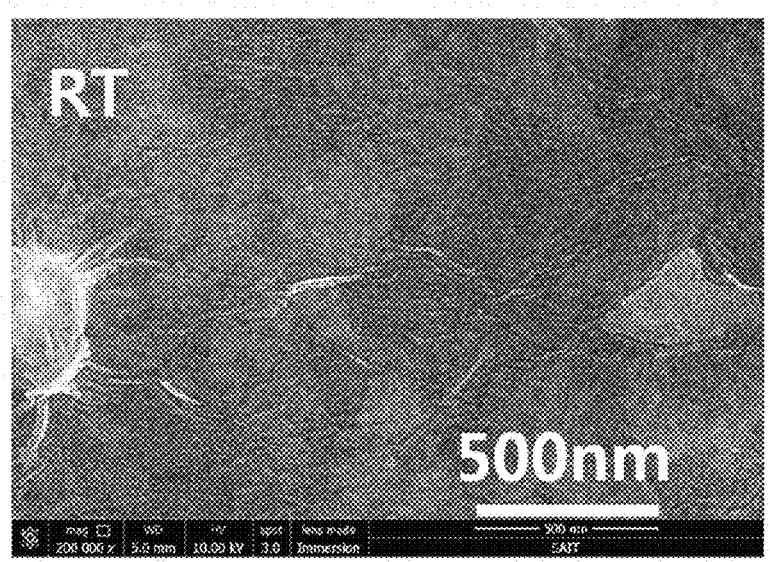
FIG. 12 is a scanning electron microscope image of a first conductive layer obtained from Comparative Example 1.

An electrical conductor is manufactured in accordance with the same procedure as in Example 1, except that the heat treatment is not performed. A scanning electron microscope photograph of the obtained electrical conductor is shown in FIG. 12. The electrical conductor obtained by the same procedure as in Example 2 is measured for sheet resistance and transmittance, and the results are shown in Table 3.

TABLE 3

|  | Rs (Ω/□) | T (%) |
|---|---|---|
| Example 1 | $4 \times 10^5$ | 96 |
| Example 2 | $2 \times 10^5$ | 96 |
| Example 3 | $0.35 \times 10^5$ | 96 |
| Comparative Example 1 | $8 \times 10^5$ | 96 |

From the results shown in Table 3, it is confirmed that the sheet resistance is significantly reduced through the heat treatment and the light transmittance is maintained. From the results shown in FIG. 9 to FIG. 12, it is confirmed that the adherence between nanosheets is improved.

Example 5

RBS Analysis

Figure 13:
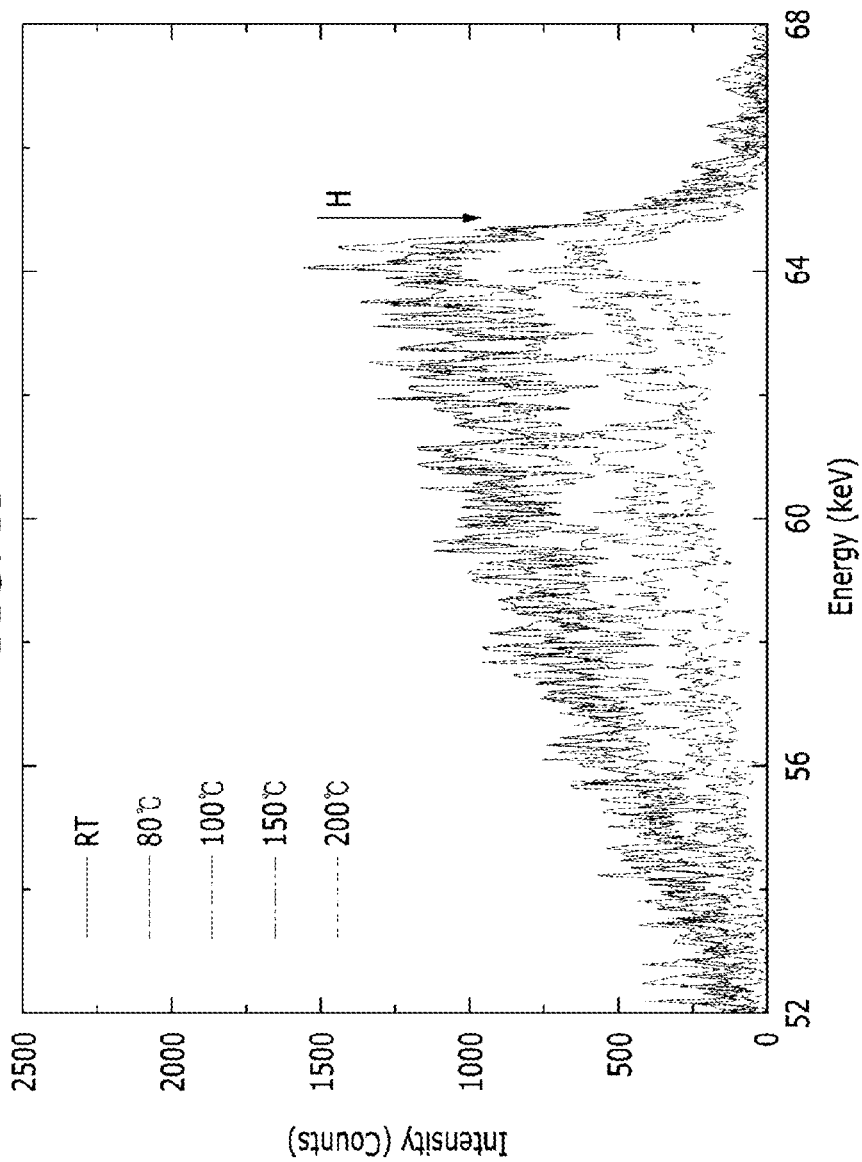
FIG. 13 is a graph of energy (kiloelectron volts, keV) versus intensity (counts) which shows Rutherford backscattering spectrometry results of Example 5.

An electrical conductor is formed on a polycarbonate substrate using the same coating liquid as in Example 2. The obtained electrical conductor is heat-treated under the heat treatment conditions shown in Table 2 and is subjected to RBS analysis using RBS measurement equipment (manufactured by KOBELCO, model name: HRBS-V500), and the results are shown in FIG. 13 and Table 2. Each electrical conductor is measured for sheet resistance in accordance with the same procedure as in Example 2, and the results are shown in Table 4.

TABLE 4

| Heat treatment temperature | Ru at % | O at % | H at % | Total atoms (×$10^{15}$) | Sheet resistance kohm/sq | H:Ru:O |
|---|---|---|---|---|---|---|
| Room temp. | 24.1 | 49.4 | 26.5 | −117 | 406 | 1.10:1:2.05 |
| 80° C. | 25.1 | 50.2 | 24.7 | −113 | 259 | 0.98:1:2 |
| 100° C. | 25.6 | 52.6 | 21.8 | −110 | 260 | 0.85:1:2.05 |
| 150° C. | 27.0 | 58.1 | 14.9 | −92 | 37 | 0.55:1:2.15 |
| 200° C. | 27.9 | 64.8 | 7.3 | −80 | 28 | 0.26:1:2.32 |

From the results shown in FIG. 13 and Table 4, it is confirmed that the content of H atoms is decreased and the content of oxygen atoms is increased according to increasing the heat treatment temperature. In addition, the sheet resistance is significantly decreased by the heat treatment.

Example 6

Evaluation of Structure Change of Nanosheets Before and After Heat Treatment

Figure 15A:
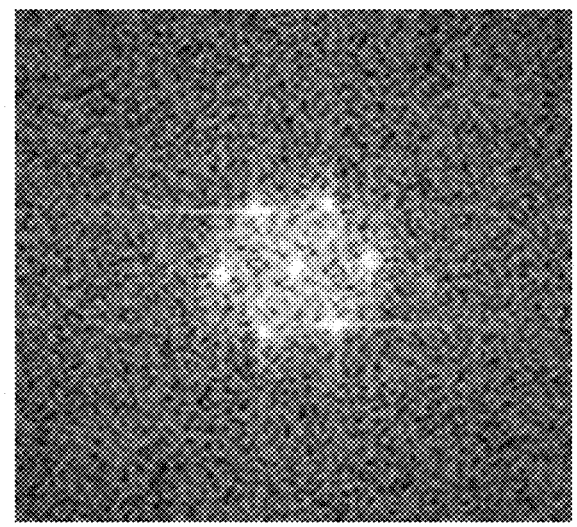
FIG. 15A and FIG. 15B show X-ray diffraction spectra of the first conductive layer before the heat treatment in Example 6.
Figure 15B:
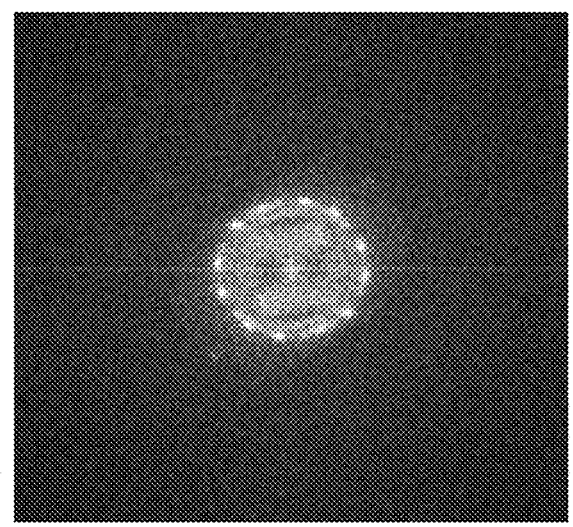
Figure 16A:
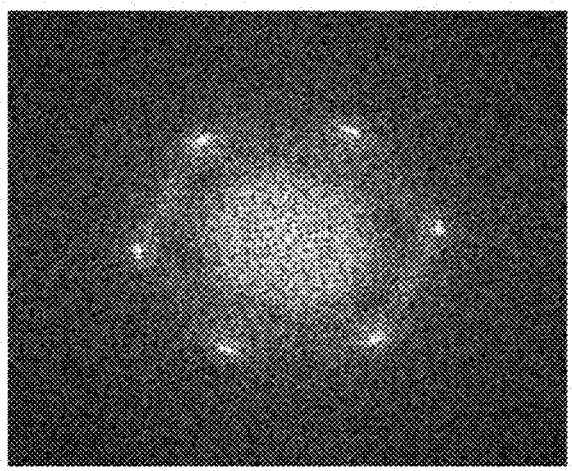
FIG. 16A and FIG. 16B show X-ray diffraction spectra of the first conductive layer after the heat treatment in Example 6.
Figure 16B:
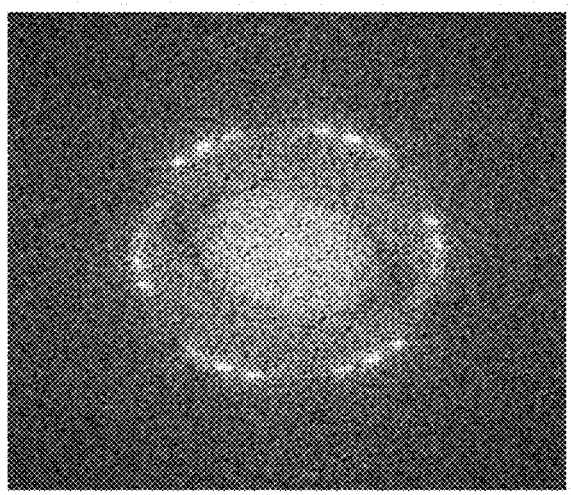

An electrical conductor is obtained in accordance with the same procedure as in Example 2 and subjected to X-ray diffraction analysis before and after the heat treatment at 200° C. for 60 min under the air atmosphere, and the results are shown in FIG. 15 (before the heat treatment) and FIG. 16 (after the heat treatment).

From FIG. 15, it is confirmed that nanosheets have three planes before the heat treatment when observing in a [001] direction, and the interplanar distances are equivalent to each other (i.e., 2.488 Å) (hexagonal structure, (100) plane).

From FIG. 16, it is confirmed that the nanosheets after the heat treatment have substantially the same structure as before the heat treatment. (interplanar distance=2.5 Å)

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrical conductor comprising:
   a first conductive layer comprising a plurality of metal oxide nanosheets, wherein a metal oxide nanosheet of the plurality of metal oxide nanosheets comprises a proton bonded to a surface of the metal oxide nanosheet,
   wherein the metal oxide nanosheet is represented by Chemical Formula 1

$MO_2$         Chemical Formula 1 wherein M is Re, V, Os, Ru, Ta, Ir, Nb, W, Ga, Mo, In, Cr, Rh, or Mn, wherein the plurality of metal oxide nanosheets has a content of hydrogen atoms of less than about 100 atomic percent, with respect to 100 atomic percent of metal atoms, when measured by Rutherford backscattering spectrometry, and wherein the plurality of metal oxide nanosheets comprises an electrical connection between contacting metal oxide nanosheets.

2. The electrical conductor of claim 1, wherein the plurality of metal oxide nanosheets has a content of hydrogen atoms of less than about 60 atomic percent, with respect to 100 atomic percent of metal atoms, when measured by Rutherford backscattering spectrometry.

3. The electrical conductor of claim 1, wherein the electrical conductor has a transmittance of greater than or equal to about 85% for light having a wavelength of 550 nm at a thickness of about 100 nm.

4. The electrical conductor of claim 1, wherein the metal oxide nanosheets of the plurality of metal oxide nanosheets have an average lateral size of greater than or equal to about 0.5 micrometers and less than or equal to about 100 micrometers, and have a thickness of less than or equal to about 3 nanometers.

5. The electrical conductor of claim 1, wherein the first conductive layer is a discontinuous layer comprising a space between adjacent metal oxide nanosheets of the plurality of metal oxide nanosheets, and wherein an area ratio of the space to the total area of the first conductive layer is less than or equal to about 50 percent.

6. The electrical conductor of claim 1, wherein the metal oxide nanosheets have peaks of a T structure when analyzed by X-ray diffraction analysis.

7. The electrical conductor of claim 1, wherein the first conductive layer further comprises a binder.

8. The electrical conductor of claim 1, wherein the first conductive layer further comprises an overcoating layer, wherein the overcoating layer is on the first conductive layer and comprises a thermosetting resin, an ultraviolet-curable resin, or a combination thereof.

9. A method of producing an electrical conductor of claim 1, the method comprising:

providing a first conductive layer including a plurality of metal oxide nanosheets, wherein a metal oxide nanosheet of the plurality of metal oxide nanosheets comprises a proton bonded to a surface of the metal oxide nanosheet, and wherein the metal oxide nanosheet is represented by Chemical Formula 1

$MO_2$           Chemical Formula 1 wherein M is Re, V, Os, Ru, Ta, Ir, Nb, W, Ga, Mo, In, Cr, Rh, or Mn, and heating the first conductive layer to produce the electrical conductor, wherein the heating is performed to provide a content of hydrogen atoms of less than about 100 atomic percent, with respect to 100 atomic percent of metal atoms, when measured by Rutherford backscattering spectrometry, and wherein the plurality of metal oxide nanosheets comprises an electrical connection between contacting metal oxide nanosheets.

10. The method of claim 9, wherein the providing a first conductive layer further comprises intercalating a sodium-substituted layered metal oxide with an intercalant, wherein the intercalant comprises an ammonium compound, an amine compound, or a combination thereof to provide the plurality of nanosheets.

11. The method of claim 9, wherein the plurality of nanosheets have peaks of a T structure when analyzed by X-ray diffraction.

12. The method of claim 9, wherein the heating is performed at a temperature of greater than or equal to about 80° C.

13. The method of claim 9, wherein the heating is performed at a temperature of greater than about 100° C. and less than or equal to about 200° C.

14. The method of claim 9, wherein the heating is performed to provide a content of hydrogen atoms, relative to 100 atomic percent of metal atoms, of less than about 60 atomic percent, when the metal oxide nanosheets are analyzed by Rutherford backscattering spectrometry.

15. An electronic device comprising the electrical conductor of claim 1.

16. The electronic device of claim 15, wherein the electronic device is a flat panel display, a touch screen panel, a solar cell, an e-window, an electrochromic mirror, a heat mirror, a transparent transistor, or a flexible display.

* * * * *